United States Patent
Ulmer

[19]

[11] Patent Number: 6,138,894
[45] Date of Patent: *Oct. 31, 2000

[54] METHOD FOR COUPLING A CIRCUIT COMPONENT TO A SUBSTRATE

[75] Inventor: Kenneth R. Ulmer, Brazoria, Tex.

[73] Assignee: Intermedics Inc., Angleton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/199,526

[22] Filed: Nov. 25, 1998

[51] Int. Cl.[7] ............................... H05K 3/34; B23K 1/06
[52] U.S. Cl. ................................. 228/111.5; 228/180.22; 228/208
[58] Field of Search ........................ 228/110.1, 111.5, 228/180.22, 208, 234.1, 235.1

[56] References Cited

U.S. PATENT DOCUMENTS

| | | | |
|---|---|---|---|
| 3,470,611 | 10/1969 | McIver et al. | |
| 5,031,308 | 7/1991 | Yamashita et al. | 29/830 |
| 5,341,979 | 8/1994 | Gupta | 228/111 |
| 5,427,301 | 6/1995 | Pham et al. | 228/110.1 |
| 5,545,589 | 8/1996 | Tomura et al. | 438/114 |
| 5,591,298 | 1/1997 | Goodman et al. | 156/580.1 |
| 5,655,700 | 8/1997 | Pham et al. | 228/106 |
| 5,669,545 | 9/1997 | Pham et al. | 228/1.1 |
| 5,693,572 | 12/1997 | Bond et al. | 437/209 |
| 5,795,818 | 8/1998 | Marrs | 438/612 |
| 5,888,847 | 3/1999 | Rostoker et al. | 438/108 |
| 5,894,166 | 4/1999 | Surridge | 257/675 |

FOREIGN PATENT DOCUMENTS

| | | | |
|---|---|---|---|
| 130607 | 4/1978 | Germany | 228/111.5 |
| 04163925 | 6/1992 | Japan | 228/111.5 |

OTHER PUBLICATIONS

Welding Research Supplement, J. N. Antonevich, "Fundamentals of Ultrasonic Soldering", pp200–s through 207–s, Jul., 1976.

*Primary Examiner*—Samuel M. Heinrich
*Attorney, Agent, or Firm*—Schwegman, Lundberg, Woessner & Kluth, P.A.

[57] ABSTRACT

A technique is utilized for coupling a circuit component to a substrate. The circuit component, such as a die, includes a plurality of contacts on one of its surfaces. The contacts may take the form of gold bumps. Solder is placed between the contacts of the circuit component and the contact pads of a substrate. The substrate is heated to about the melting point of the solder, and pressure and ultrasonic energy are used to cause the solder to couple the contacts of the circuit component to the contact pads of the substrate.

38 Claims, 3 Drawing Sheets

METHOD FOR COUPLING A CIRCUIT COMPONENT TO A SUBSTRATE

BACKGROUND OF THE INVENTION

1. Field of the Invention

This invention relates generally to circuit fabrication and, more particularly, to a method for coupling a circuit component to a substrate.

2. Background of the Related Art

In the fabrication of electrical circuits, it is often desirable to couple a circuit component to a substrate. For instance, one particular example involves the coupling of an integrated circuit chip to a ceramic substrate or to a printed circuit board.

There are various methods for affixing metal contacts of an integrated circuit chip, for instance, to complementary metal contacts on a substrate. For example, a traditional soldering method could be used in which solder bumps are formed on the contacts of the substrate and flux is applied to the contacts of the integrated circuit chip. The contacts on the integrated circuit chip are then placed adjacent the solder bumps on the substrate and the entire assembly is heated to melt the solder. The flux attracts the solder to the contacts on the integrated circuit chip to ensure proper bonding.

Once the bonding has taken place, the flux residue is removed, because any flux which remains may create conductivity or corrosion problems that may adversely affect the performance of the circuit. However, the space between the circuit component and the substrate is typically quite small, usually on the order of a few thousandths of an inch. Due to this constraint, it is difficult for currently used cleaning mediums to penetrate and remove all flux residue from in and under the circuit component.

A process known as thermocompression ultrasonic gold to gold diffusion may be used to create such contacts without the use of flux. In this process, gold contacts are provided on the integrated circuit chip and on the substrate. The gold contacts of the integrated circuit chip are then placed adjacent the gold contacts of the substrate and pressure is applied onto the chip in the amount of approximately 10 psi. Ultrasonic energy of approximately 100 kH is applied to the structure, and the entire assembly is heated to a temperature in the range of 300EC. to 400EC. These conditions cause the gold atoms in the pairs of adjacent contacts to diffuse into one another to couple the contacts together.

Although this process solves the problem of flux removal, it still exhibits various disadvantages. First, the cost of the gold contacts may be an undesirable expense. Second, because the contacts are fused together, rather than soldered, it is difficult, if not impossible, to remove the chip from the substrate in the event that the part needs to be reworked. Third, the pressure applied to the chip may introduce microscopic stress fractures which may adversely affect the performance of the chip. Finally, many chips may be damaged by a temperature in the range of 300/C. to 400/C.

Another method may be performed at room temperature and without flux. This method is a diffusion method similar to the one described above. However, instead of applying a relatively high temperature, a pressure of approximately 25 to 35 psi is applied to the chip, along with ultrasonic energy, in order to diffuse the opposing gold contacts together. Except for the problems related to high temperature, this process suffers from all of the problems discussed above. In fact, due to the higher pressures required, more and larger stress fractures are likely to be created in the chip during processing.

The present invention may address one or more of the problems discussed above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a method of coupling a circuit component having a contact to a substrate to form an assembly. The method includes the acts of: (a) placing solder on the substrate; (b) positioning the circuit component on the substrate such that the contact on the circuit component contacts the solder; (c) heating the substrate to a temperature sufficient to melt the solder; (d) applying ultrasonic energy to the assembly; and (e) applying pressure to force the circuit component and the substrate together.

In accordance with another aspect of the present invention, there is provided a method of coupling a circuit component having a plurality of contacts to a substrate having a plurality of contacts to form an assembly. The method includes the acts of: (a) placing solder over each contact of the substrate; (b) positioning the circuit component on the substrate such that each contact on the circuit component contacts the solder over each respective contact of the substrate; (c) heating the substrate to a temperature sufficient to melt the solder; (d) applying ultrasonic energy to the assembly; and (e) applying pressure to force the circuit component and the substrate together.

In accordance with still another aspect of the present invention, there is provided a method of coupling a bare die having a plurality of contacts to a substrate having a plurality of contacts to form an assembly. The method includes the acts of: (a) forming a gold bump over each contact of the die; (b) placing eutectic solder over each contact of the substrate; (c) positioning the die on the substrate such that each gold bump contacts the solder over each respective contact of the substrate; (d) locally heating the substrate to a temperature minimally sufficient to melt the solder; (e) applying ultrasonic energy to the assembly; (f) applying pressure of less than ten pounds per square inch to force the die and the substrate together; and (g) cooling the assembly.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

As discussed in detail below in conjunction with the drawings, the methods and apparatus for assembling electronic devices may be used in the manufacture of a variety of electronic devices. However, a cardiac stimulator is presented below as one example of an electronic device that may benefit from the method and apparatus disclosed herein. As is well known, a cardiac stimulator is a medical device used to facilitate heart function. For instance, if a person=s heart does not beat properly, a cardiac stimulator may be used to provide relief. The cardiac stimulator delivers electrical stimulation to a patient=s heart to keep it beating properly. In fact, cardiac stimulators generally fall into two categories, pacemakers and defibrillators, although some cardiac stimulators may perform both functions. Pacemakers supply electrical pulses to the heart to keep the heart beating at a desired rate, while defibrillators supply a relatively large electrical pulse to the heart to help the heart recover from cardiac failure.

Figure 1:
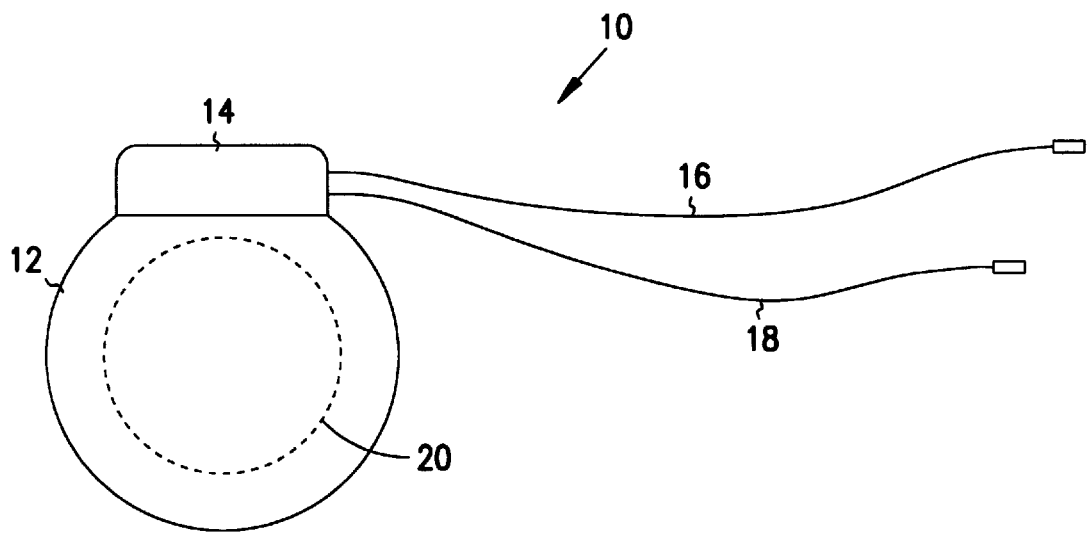
FIG. 1 illustrates a cardiac stimulator.

Turning now to the drawings, and referring initially to FIG. 1, a cardiac stimulator is illustrated and generally designated by a reference numeral 10. The body of the cardiac stimulator 10 typically includes a can 12 and a header 14. One or more leads, such as an atrial lead 16 and a ventricular lead 18, are typically coupled to the header 14 to transmit electrical stimulation pulses to the patient's heart. The electrical stimulation pulses are generated by electronic circuitry 20 contained within the can 12 of the cardiac stimulator 10. The cardiac stimulator 10 also uses the electronic circuitry 20 to perform its other functions, so the circuitry 20 typically includes a microprocessor that is coupled to a variety of circuits, such as a memory, stimulus generators, and sense circuits.

Typically, the circuit components which make up the electronic circuitry 20 include a number of integrated circuit chips which are mounted directly onto a substrate. Thus, the following examples depict the mounting of a die onto a substrate. However, it should be understood that the process and apparatus for affixing a circuit component to a substrate may also be applicable to other types of circuit components, such as integrated circuit packages.

Figure 2:
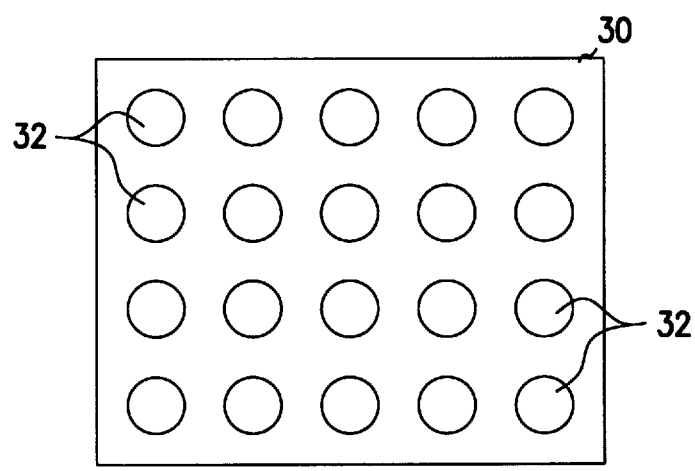
FIG. 2 illustrates a bottom view of an exemplary circuit component having gold contact bumps.

FIG. 2 illustrates the bottom of a circuit component, such as a die 30. A plurality of contacts 32 are formed on the bottom of the die 30. In this example a four by five matrix of contacts 32 is illustrated, with it being understood that the number, position, and placement of the contacts 32 may vary. As is well known, the contacts 32 are primarily provided to couple circuitry internal to the die 30 to circuitry external to the die 30.

In this example, the contacts 32 are gold bumps. The gold bumps may be created by any suitable process such as those commonly used in the industry. Of course, it should be understood that the process described herein may also find application for use with circuit components which use contacts other than gold bumps. For example, it is currently believed that circuit components having copper contacts, or other types of solderable contacts, may also benefit from this process.

Figure 3:
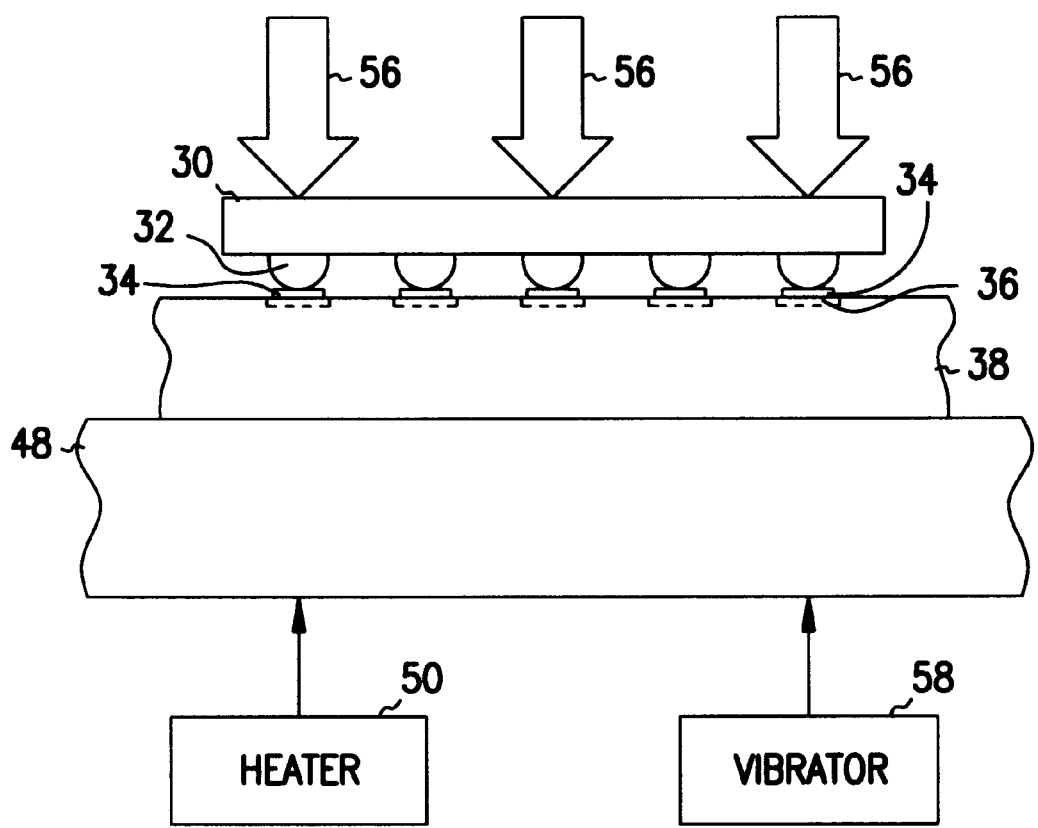
FIG. 3 illustrates a side view of the circuit component of FIG. 2 being affixed to a substrate.
Figure 4:
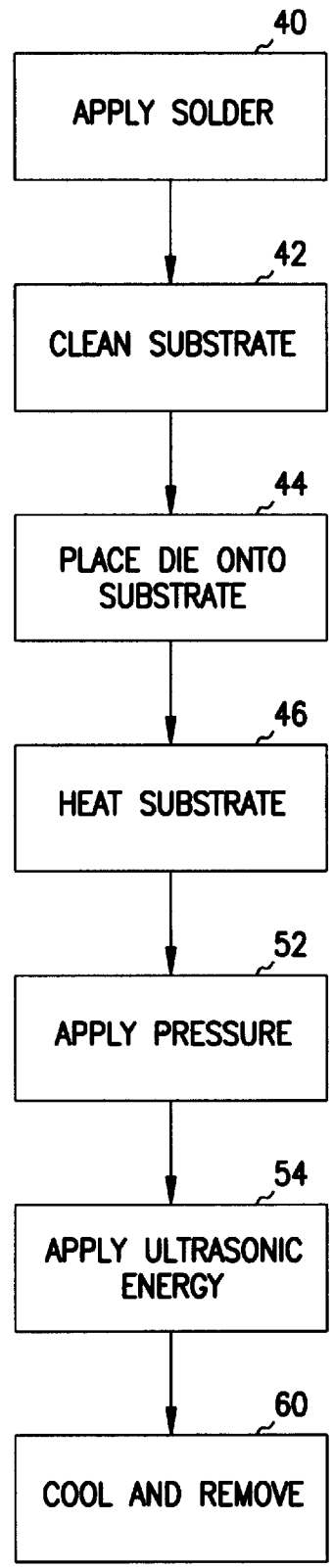
FIG. 4 illustrates a flow chart of an exemplary process for affixing the circuit component of FIG. 2 to the substrate.

Referring now to FIGS. 3 and 4, an exemplary apparatus and process for coupling the die 30 to a substrate will now be described. Of course, prior to performing the process described below it may be advantageous to test the electrical performance of the die 30 so as to provide a known good die. One of the first steps of the process involves applying solder 34 to the contact pads 36 on the substrate 38. (Block 40). The use of solder to attach the contacts 32 of the die 30 to the contact pads 36 of the substrate 38 offers various advantages over gold-to-gold diffusion, as discussed below. Although the solder 34 may be any suitable solder made of any of a number of alloys, the use of eutectic solder is typically advantageous, as will become clear from the discussion below. In this example, the solder may be 63% tin and 37% lead.

Prior to or after application of the solder 34 to the substrate 38, the substrate 38 may be cleaned. (Block 42). The substrate may be cleaned by any suitable method, such as chemical degreasing. As discussed previously, a bare substrate is much easier to clean than one which has a circuit component attached to it. The solder may be applied by any suitable method, which may include screen printing, dispensing, or solder dipping, such as wave soldering.

After the solder 34 has been applied to the substrate 38, the die 30 is positioned so that the contacts 32 are placed on the solder 34. (Block 44). As is well known, the positioning of the contacts 32 on the die 30 typically correspond to the placement of the contact pads 36 on the substrate 38. Because of the number and relatively small size of the contacts 32, a pick and place machine (not shown) is typically used to place and position the die 30 onto the substrate 38, although any suitable method and/or apparatus may be used.

Once the die 30, the solder 34, and the substrate 38 have been properly positioned, these elements may be coupled together. To summarize this process, the solder 34 is heated. However, flux is not used to wet the contacts 32. Rather, ultrasonic energy is applied to eliminate or reduce the surface tension of the solder to allow the molten solder to wet the contacts 32. A slight pressure is applied to maintain the position of the die 30 with respect to the substrate 38 during the application of the ultrasonic energy.

Rather than heating the entire assembly as in certain conventional methods, it is advantageous to heat only the substrate 38. (Block 46). As illustrated in FIG. 3, the substrate 38 may be placed on a tool plate 48 that is coupled to a suitable heater 50. The temperature of the upper surface of the substrate 38 is advantageously increased to about the melting temperature of the solder 34. Alternatively, hot air or gas flow directly on the die/substrate area may be used for melting the solder 34, but such methods may not be as advantageous as heating only the substrate 38. As mentioned previously, it is typically advantageous to use eutectic solder, which has the lowest melting point of a particular solder alloy, to minimize the temperature of the substrate 38.

To complete the coupling of the die 30 to the substrate 38, pressure and ultrasonic energy are applied for a given period of time. (Blocks 52 and 54). Usually, 10 to 30 seconds is sufficient to ensure proper bonding. The pressure is applied generally in the direction of the arrows 56. Typically, the pressure may range from about 1 pound per square inch to about 10 pounds per square inch, with a pressure of about 5 psi being used in this example. The pressure may be applied in any suitable manner, such as by using weight, mechanical means, or hydraulic/ pneumatic means. The ultrasonic energy may be applied to the assembly in a variety of manners. In this example, a vibrator 58, such as a horn, is coupled to the tool plate 48 to transfer ultrasonic energy to the assembly. The ultrasonic energy may have a frequency range of 20 k to 80 k Hz, with a frequency of about 60 k Hz.

After the pressure, heat, and ultrasonic energy have been applied for a given duration of time, the assembly may be allowed to cool to a temperature below the melting point of the solder prior to removing the assembly from the tool plate 48. (Block 60). Although the attachment of a single circuit component to a substrate has been described in this exemplary process, it should be understood that a plurality of circuit components may be coupled to a substrate simultaneously using this process.

This unique combination of materials, temperature, pressure, and ultrasonic energy offers various advantages over conventional techniques. The temperature is selected to melt the solder, rather than to promote diffusion, while the ultrasonic energy does away with the need for flux. The pressure assures contact between the die 30 and the substrate 38 during the ultrasonic action. Because this technique uses no flux, flux residue need not be removed and is not present in the finished assembly to cause various problems. Furthermore, because this technique uses solder, the die 30 may be removed from the substrate 38 by heating the solder to its reflow temperature, as opposed to the previously mentioned diffusion techniques which do not permit such rework. Finally, the temperature and pressure are relatively low compared with conventional diffusion techniques, so the possibility of damaging the circuit component during the process of coupling it to the substrate is minimized.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of coupling a circuit component having a contact to a substrate to form an assembly, the method comprising the acts of:
   (a) placing solder on the substrate;
   (b) positioning the circuit component on the substrate such that the contact on the circuit component contacts the solder;
   (c) heating the substrate to a temperature sufficient to melt the solder;
   (d) applying ultrasonic energy to the assembly; and
   (e) applying pressure to force the circuit component and the substrate together.

2. The method, as set forth in claim 1, wherein the circuit component comprises a plurality of contacts, wherein the substrate comprises a plurality of contacts, and wherein the act (a) comprises the act of placing solder over each contact of the substrate.

3. The method, as set forth in claim 1, wherein the act (a) comprises the act of:
   placing eutectic solder on the substrate.

4. The method, as set forth in claim 1, wherein the act (b) comprises the act of:
   using a pick and place machine to position the circuit component on the substrate.

5. The method, as set forth in claim 1, wherein the act (c) comprises the act of:
   placing the substrate on a heating tool plate.

6. The method, as set forth in claim 1, wherein the act (c) comprises the act of:
   locally heating the substrate.

7. The method, as set forth in claim 1, wherein the act (c) comprises the act of:
   heating the substrate to a temperature minimally sufficient to melt the solder.

8. The method, as set forth in claim 5, wherein the act (d) comprises the act of:
   coupling a vibrator to the tool plate.

9. The method, as set forth in claim 1, wherein the act (d) comprises the act of:
   applying ultrasonic energy having a frequency range of 20 k to 80 k Hz.

10. The method, as set forth in claim 1, wherein the act (e) comprises the act of:
    applying pressure in a range of 1 pound per square inch to 10 pounds per square inch.

11. The method, as set forth in claim 1, further comprising the acts of:
    reflowing the solder; and
    removing the circuit component from the substrate.

12. The method, as set forth in claim 1, wherein the circuit component comprises a bare die.

13. The method, as set forth in claim 1, wherein the contact comprises a gold bump.

14. The method, as set forth in claim 1, wherein each of the acts (a) through (e) are performed in the recited order.

15. A method of coupling a circuit component having a plurality of contacts to a substrate having a plurality of contacts to form an assembly, the method comprising the acts of:
    (a) placing solder over each contact of the substrate;
    (b) positioning the circuit component on the substrate such that each contact on the circuit component contacts the solder over each respective contact of the substrate;
    (c) heating the substrate to a temperature sufficient to melt the solder;
    (d) applying ultrasonic energy to the assembly; and
    (e) applying pressure to force the circuit component and the substrate together.

16. The method, as set forth in claim 15, comprising the act of:
    forming a gold bump over each contact on the circuit component.

17. The method, as set forth in claim 15, wherein the act (a) comprises the act of:
    placing eutectic solder on the substrate.

18. The method, as set forth in claim 15, wherein the act (b) comprises the act of:
    using a pick and place machine to position the circuit component on the substrate.

19. The method, as set forth in claim 15, wherein the act (c) comprises the act of:
    placing the substrate on a heating tool plate.

20. The method, as set forth in claim 15, wherein the act (c) comprises the act of:
    locally heating the substrate.

21. The method, as set forth in claim 15, wherein the act (c) comprises the act of:
    heating the substrate to a temperature minimally sufficient to melt the solder.

22. The method, as set forth in claim 19, wherein the act (d) comprises the act of:
    coupling a vibrator to the tool plate.

23. The method, as set forth in claim 15, wherein the act (d) comprises the act of:
    applying ultrasonic energy having a frequency range of 20 k to 80 k Hz.

24. The method, as set forth in claim 15, wherein the act (e) comprises the act of:
    applying pressure in a range of 1 pound per square inch to 10 pounds per square inch.

25. The method, as set forth in claim 15, further comprising the acts of:
    reflowing the solder; and
    removing the circuit component from the substrate.

26. The method, as set forth in claim 15, wherein the circuit component comprises a bare die.

27. The method, as set forth in claim 15, wherein each of the acts (a) through (e) are performed in the recited order.

28. A method of coupling a bare die having a plurality of contacts to a substrate having a plurality of contacts to form an assembly, the method comprising the acts of:

(a) forming a gold bump over each contact of the die;

(b) placing eutectic solder over each contact of the substrate;

(c) positioning the die on the substrate such that each gold bump contacts the solder over each respective contact of the substrate;

(d) locally heating the substrate to a temperature minimally sufficient to melt the solder;

(e) applying ultrasonic energy to the assembly;

(f) applying pressure of less than ten pounds per square inch to force the die and the substrate together; and (g) cooling the assembly.

29. The method, as set forth in claim 28, wherein the act (b) comprises the act of:

placing eutectic solder on the substrate.

30. The method, as set forth in claim 28, wherein the act (c) comprises the act of:

using a pick and place machine to position the die on the substrate.

31. The method, as set forth in claim 28, wherein the act (d) comprises the act of:

placing the substrate on a heating tool plate.

32. The method, as set forth in claim 28, wherein the act (d) comprises the act of:

locally heating the substrate.

33. The method, as set forth in claim 28, wherein the act (d) comprises the act of:

heating the substrate to a temperature minimally sufficient to melt the solder.

34. The method, as set forth in claim 31, wherein the act (e) comprises the act of:

coupling a vibrator to the tool plate.

35. The method, as set forth in claim 28, wherein the act (e) comprises the act of:

applying ultrasonic energy having a frequency range of 20 k to 80 k Hz.

36. The method, as set forth in claim 28, wherein the act (f) comprises the act of:

applying pressure in a range of 1 pound per square inch to 10 pounds per square inch.

37. The method, as set forth in claim 28, further comprising the acts of:

reflowing the solder; and removing the die from the substrate.

38. The method, as set forth in claim 28, wherein each of the acts (a) through (g) are performed in the recited order.

* * * * *